United States Patent [19]

Kawauchi et al.

[11] Patent Number: 5,278,786
[45] Date of Patent: Jan. 11, 1994

[54] NON-VOLATILE SEMICONDUCTOR MEMORY DEVICE HAVING AN AREA RESPONSIVE TO WRITING ALLOWANCE SIGNAL

[75] Inventors: Koichi Kawauchi; Seiichiro Asari, both of Hyogo, Japan

[73] Assignee: Mitsubishi Denki Kabushiki Kaisha, Tokyo, Japan

[21] Appl. No.: 771,832

[22] Filed: Oct. 8, 1991

Related U.S. Application Data

[63] Continuation of Ser. No. 461,585, Jan. 5, 1990, abandoned.

[30] Foreign Application Priority Data

Apr. 11, 1989 [JP] Japan ............... 1-92533

[51] Int. Cl.⁵ ............... G11C 7/00; G11C 8/00; G11C 11/34
[52] U.S. Cl. ............... 365/185; 365/195; 365/228; 365/230.03
[58] Field of Search ............... 365/184, 185, 194, 195, 365/228, 230.03

[56] References Cited

U.S. PATENT DOCUMENTS

| | | | |
|---|---|---|---|
| 4,521,853 | 6/1985 | Guttag | 364/200 |
| 4,796,235 | 1/1989 | Sparks et al. | 365/228 |
| 4,805,109 | 2/1989 | Kroll et al. | 364/900 |
| 4,811,293 | 3/1989 | Knothe et al. | 365/230.03 |
| 4,853,896 | 8/1989 | Yamaguchi | 365/230.03 |
| 4,975,878 | 12/1990 | Boddu et al. | 365/228 |

FOREIGN PATENT DOCUMENTS 63-7599  1/1988  Japan .

Primary Examiner—Alyssa H. Bowler
Assistant Examiner—Michael A. Whitfield
Attorney, Agent, or Firm—Lowe, Price, LeBlanc & Becker

[57] ABSTRACT

A non-volatile semiconductor memory device comprises an area in which only one rewriting is possible and an area in which rewriting is possible repeatedly. A control circuit generates a high voltage from a boosting circuit and operates a writing circuit to write data in the rewritable area whose address designated by an address register/decoder. The control circuit allows writing of data into the area in which only one rewriting is possible by the writing circuit in response to an external signal. Therefore, even if the writing mode is set influenced by the unstable state of the power supply, destruction of the data in the area in which only one rewriting is possible can be prevented.

4 Claims, 7 Drawing Sheets

NON-VOLATILE SEMICONDUCTOR MEMORY DEVICE HAVING AN AREA RESPONSIVE TO WRITING ALLOWANCE SIGNAL

This application is a continuation of application Ser. No. 07/461,585 filed Jan. 5, 1990 now abandoned.

BACKGROUND OF THE INVENTION

1. Field of the Invention

The present invention relates to non-volatile semiconductor memory devices and, more specifically, to a non-volatile semiconductor memory device having an electrically rewritable non-volatile semiconductor as a memory element.

2. Description of the Background Art

In an EEPROM as an electrically rewritable non-volatile semiconductor memory device, a high voltage of 20V is applied to a memory cell corresponding to a binary information in accordance with a writing mode signal applied from a controller, and threshold value of the memory cell is changed to receive charges, whereby the information is written. Methods for applying high voltage to the memory cell comprise a method of applying the voltage from a voltage source directly to an external terminal provided in each memory cell, and a method of applying a normal voltage 5V which is boosted by a boosting circuit provided in an IC to apply the boosted voltage. One example of the latter method is disclosed in Japanese Patent Laying-Open No. 63-7599.

FIG. 5 is a block diagram showing a whole structure of a conventional EEPROM. Referring to FIG. 5, a clock pulse is applied to an input register 101 and data and address are serially inputted thereto. The input register 101 serially reads the data and the address in response to the clock pulse, loads the data in a data register 103 and loads the address to an address register/decoder 104. The clock pulse is also applied to a timing generation circuit 102, which generates timing signals in response to the clock pulse to apply the same to a mode register 105. The mode register 105 is provided for loading a writing mode signal or an erasing mode signal. The writing mode signal or the erasing mode signal loaded in the mode register 105 is applied to a control circuit 1.

The data loaded in the data register 103 and the address signals loaded in the address register/decoder 104 are applied to a memory cell 100. A writing mode signal or an erasing mode signal is applied from the control circuit 1 to the memory cell 100. The writing mode signal is also applied to a boosting circuit 2 and a writing circuit 111. The boosting circuit 2 boosts a supply voltage of +5V to a high voltage of 20V in response to the writing mode signal or the erasing mode signal to apply the same to the memory cell 100 through the writing circuit 111. When the high voltage is applied to a cell of the designated address, the memory cell 100 writes the information in the cell. A sensing circuit 101 amplifies the information read from the memory cell 100 to apply the same to an output circuit 109.

FIG. 6 is a specific block diagram of the memory cell portion shown in FIG. 5, FIG. 7 is a specific electric circuit diagram of the boosting circuit shown in FIG. 6, and FIG. 8 is a specific electric circuit diagram of a high voltage switch.

Referring to FIGS. 6 to 8, the portions near the memory cell will be described in more detail. FIG. 6 shows an example of a memory matrix MA in which memory cells M11 ... M1n+1, M21 ... M2n+1, M31 ... M3n+1, M41 ... M4n+1 arranged in a matrix of two columns x 2 rows for rewriting n bit data at one time. The memory cell M11 comprises a selective transistor and a memory transistor. Other memory cells have the same structure. The selective transistor of each of the memory cells M11 ... M1n+1, M21 ... M2n+1, M31 ... M3n+1, M41 ... M4n+1 is connected to each other in the row direction by the word lines W1, W2 and in the column direction by digit lines D11 ... 1n, D21 .. . D2n+1. High voltage switches 71 and 72 are connected to the word lines W1 and W2, high voltage switches 52 ... 5n+1 are connected to the digit lines D11..., D1n+1 and high voltage switches 62 ... 6n+1 are connected to the digit lines D21 ... D2n+1. Transistors 81 and 82 transmit high voltage on a control gate line CG1 to the control gate of the memory cells M11 . .. M1n+1, M21 ... M2n+1 and transistors 83 and 84 transmit high voltage on a control gate line CG2 to the control gates of the memory cells M31 ... M3n+1, M41 .. : M4n+1. Drains of the transistors 81 and 82 are connected to the high voltage switch 51, and the drains of the transistors 83 and 84 are connected to the high voltage switch 61.

The control circuit 1 applies a controlling signal for generating a high voltage from the boosting circuit 2 in the writing mode and in the erasing mode to the boosting circuit 2. The boosting circuit 2 comprises an oscillator 21 as shown in FIG. 7. The oscillator 21 starts the oscillating operation in response to the controlling signal from the control circuit 1. The boosting circuit 2 comprises n channel transistors 23 connected in series with the gates and drains connected to each other and capacitors 24 connected between the source of each of the transistors 23 and the output of the oscillator 21 or an output of an inverter 22 inverting the output from the oscillator 21. The boosting circuit 2 is generally called a charge pump, which boosts the output from the oscillator 21 by the combination of the N channel transistors 23 and the capacitors 24 to apply a high voltage to the high voltage switches 51, 52 ... 5n+1, 61, 62 ... 6n+1, 71 and 72.

The control circuit 1 applies a control signal in the writing mode and in the erasing mode to one input end of each of the AND gates 31 and 41. An address signal Y1 is applied to the other input end of the AND gate 31, and an address signal Y2 is applied to the other input end of the AND gate 41. Data D1 ... Dn are applied to one input end of the AND gates 32 ... 3n+1, respectively, and the address signal Y1 is applied to the other input end. The data D1 ... Dn are applied to one input end of the AND gates 42 ... 4n+1, respectively, and the address signal Y2 is applied to the other input end. Address signals X1 and X2 are applied to the high voltage switches 71 and 72.

Referring to FIG. 8, the structure of the high voltage switch 50 will be described in the following. An output from any one of the AND gates 31, 32 ... 3n+1, 41, 42 ... 4n+1 and X1, X2 shown in FIG. 6 is applied to the inverter 501. The output from the inverter 501 is applied to the gate of N channel transistor 502 which has its source connected to the ground and its drain connected to the drain of an N channel transistor 503 and to the gate of an N channel transistor 504. The gate and the source of the N channel transistor 503 are connected to one end of a capacitor 505 and to the source of the N channel transistor 504. A high voltage is applied from the boosting circuit 2 to the drain of the N channel transistor 504, while the oscillation output from the oscillator 21 is applied to the other end of the capacitor 505. A high voltage is outputted from the drain of the N channel transistor 502.

Operation of a conventional EEPROM will be described in the following. The high voltage switch 50 is a switching element for switching a high voltage (about 20V) for writing into the EEPROM by peripheral 5V signals. When a "H" level (5V) signal is inputted to the gate of the N channel transistor 502, the N channel transistor 502 is turned on and a "L" level signal is outputted from the drain thereof. When a "L" level (0V) signal is inputted to the gate of the N channel transistor 502, the N channel transistor 502 is turned off, and the capacitor 505, and N channel transistors 503 and 504 function as a last stage of the boosting circuit 2 to output a high voltage.

The operation of erasing and writing data in the memory cell M11 which is at the first row and first column of the 2×2 memory cell array MA shown in FIG. 6 will be described in the following as an example. The EEPROM has two modes, that is, the erasing mode and the writing mode. At first, the erasing mode will be described. The erasing of data is carried out by applying a high voltage of about 20V to the gate (generally called a control gate) of a memory transistor of the memory cell M11. A control signal for starting oscillation is applied from the control circuit 1 to the oscillator 21 of the boosting circuit 2. The oscillator 21 starts oscillation in response to the control signal and the boosting circuit 2 generates a high voltage. On this occasion, the control signal E outputted from the control circuit 1 is set to the "H" level, and the data D1 to Dn are set to the "L" level. Now, the information in the memory cell D11 at the first row and first column is to be erased, so that the address signal X1 is set to the "H" level, X2 is set to the "L" level, Y1 is set to the "H" level and Y2 is set to the "L" level. Consequently, the AND gate 31 conducts, the high voltage switch 51 sets the control gate signal CG1 at 20V and the high voltage switch 71 sets the word signal W1 at 20V. Consequently, the transistor 81 is rendered conductive, a high voltage is applied to the control gate of the memory cell M11, whereby the data is erased.

Writing of the data is carried out by applying a high voltage of 20V to the drain of a memory transistor in the memory cell. Namely, in the writing mode, the control signal E is set to the "L" level and the data D1 to Dn are set at respective values. The address signals X1, X2, Y1 and Y2 are set in the same manner as in the erasing mode. When the control gate signal CG1 is kept at the "L" level and the data D1 to Dn are at the "L" level, the high voltage is not transmitted to the digit signal D11, so that writing of data to the memory cell is not carried out. When the data D1, for example, is set at the "H" level, the high voltage is transmitted to the digit signal D11, so that writing of data to the memory cell M11 is carried out.

When the EEPROM shown in FIG. 6 is used as a memory element, there is a possibility of the data stored in the EEPROM being destroyed when the power supply is turned on/off or the applied voltage is stopped for an instant. More specifically, the power is supplied through an external terminal to the boosting circuit 2. When the high voltage is applied to the memory cell and the signal outputted from the controller becomes unstable due to the turning on/off the power supply or the instant stoppage, the memory device may be erroneously set to the writing mode. When a boosting circuit 2 such as shown in FIG. 7 is provided in the memory device and the signal outputted from the controller becomes unstable due to the turning on/off of the power supply or the instant stoppage, the writing mode may be erroneously set.

Electrical rewriting of data is possible in an EEPROM. However, in most cases, they are used as ROMs, that is, only a portion is used for writing data and other regions are used only for reading with the data once written being maintained as they are. Therefore, various measurements have been proposed in order to prevent fatal damage of the system derived from the destruction of the written data by the above described causes.

For example, measurements such as providing pull up and pull down resistances to an input terminal, provision of a power supply detecting circuit inside or outside of the IC so as to turn off the main power supply after the external signal lines are established, and so on have been proposed. However, these measurements are not enough to prevent erroneous writing.

SUMMARY OF THE INVENTION

Therefore, an object of the present invention is to provide a non-volatile semiconductor memory device including, in a portion, a memory area in which electrical rewriting is allowed only when a writing allowance signal is applied.

Briefly stated, in the present invention, a semiconductor memory element having first and second memory areas in which electrical data writing is possible is provided. Data can be arbitrarily written in the first memory area, while writing of data in the second memory area is allowed only when an external signal is applied.

Therefore, in accordance with the present invention, writing of data in the second memory area is allowed only when a signal is externally applied thereto, so that even if the writing mode is erroneously set in the memory element due to unstable state of the power supply, the destruction of the data in the second memory area can be prevented.

In accordance with a preferred embodiment of the present invention, data are written in the first memory area of the semiconductor memory element by a first writing circuit, and data are written in the second memory area when a writing allowance signal is applied to a second writing circuit.

In accordance with another preferred embodiment of the present invention, when a power supply voltage is boosted to generate a high voltage and an address signal for designating an address in the first memory area is applied to a first switching circuit, the high voltage is applied to the first memory area and the data are written, and when an address signal for designating the second memory area and the writing allowance signal is applied to a second switching circuit, the high voltage is applied to the second memory area and the data are written therein. More preferably, a first high voltage generating circuit for generating a high voltage for writing data in the first memory area and a second high voltage generating circuit for generating a high voltage for writing data in the second memory area are provided.

In a further, more preferred embodiment, a plurality of memory transistors constituting the first and second memory areas and selective transistors for activating corresponding memory transistors formed corresponding to the memory transistors are provided. When a column address signal for designating column address of the first memory area is applied to a first column switching circuit, a high voltage is applied to a first electrode of the corresponding selective transistor, when a row address signal for designating a row in the first memory area is applied to a first row switching circuit, a high voltage is applied to a control electrode of the corresponding selective transistor, whereby a corresponding memory transistor is activated by the selective transistor to realize data writing. In the same manner, when a column address signal for designating a column in the second memory area is applied to a second column switching circuit, a high voltage is applied to a first electrode of the corresponding selective transistor, and when a row address signal for designating a row address of the second memory area is applied to a second switching circuit, a high voltage is applied to the control electrode of the corresponding selective transistor, whereby data writing in the corresponding memory transistor is realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
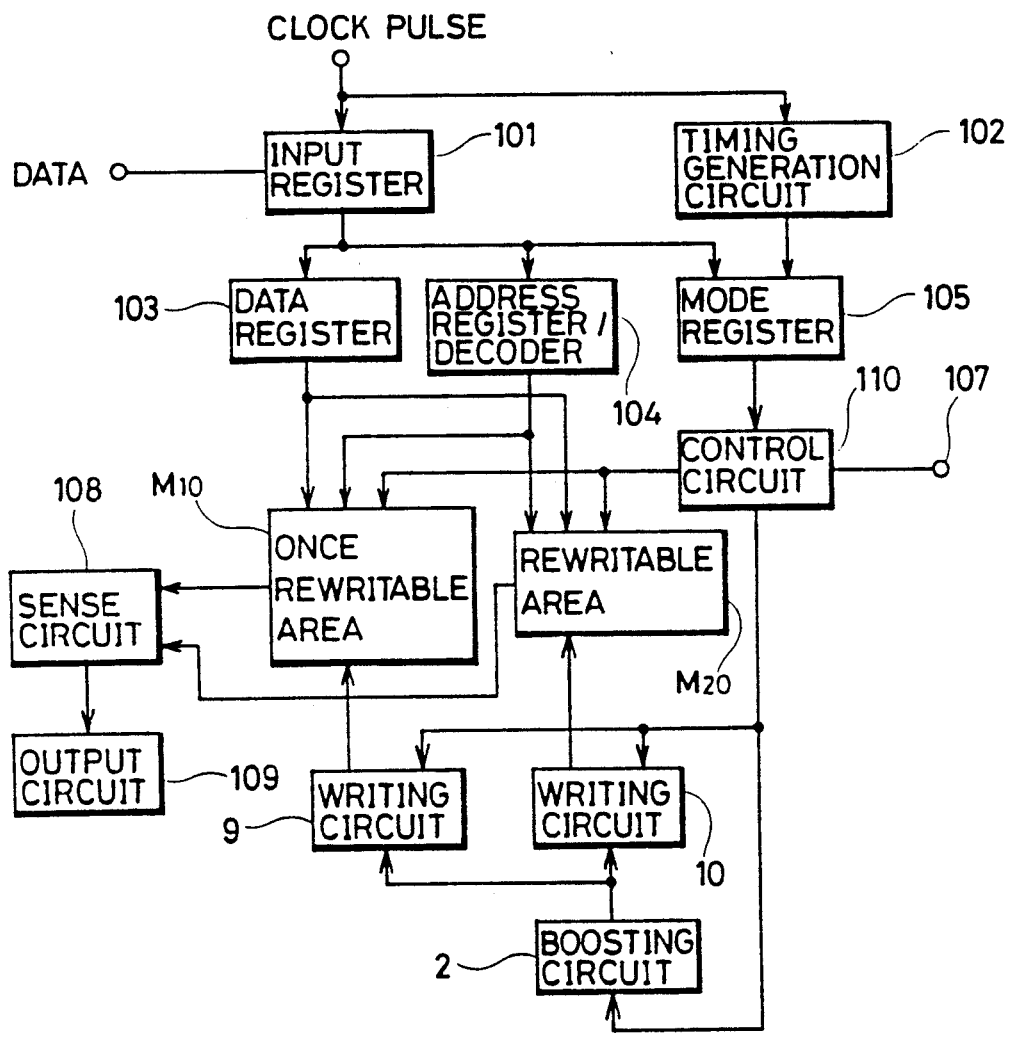
FIG. 1 is a schematic block diagram showing a whole structure of one embodiment of the present invention.

FIG. 1 is a schematic block diagram showing the whole structure of one embodiment of the present invention. Referring to FIG. 1, a memory matrix is divided into an area M10 in which only one rewriting is possible and an area M20 in which rewriting is possible repeatedly. Writing circuits 9 and 10 for writing data in the memory cells are provided corresponding to the areas M10 and M20, respectively. A control circuit 110 allows writing of data into the area M10 only when a "H" level control signal, for example, is applied from an external terminal 107.

Figure 2:
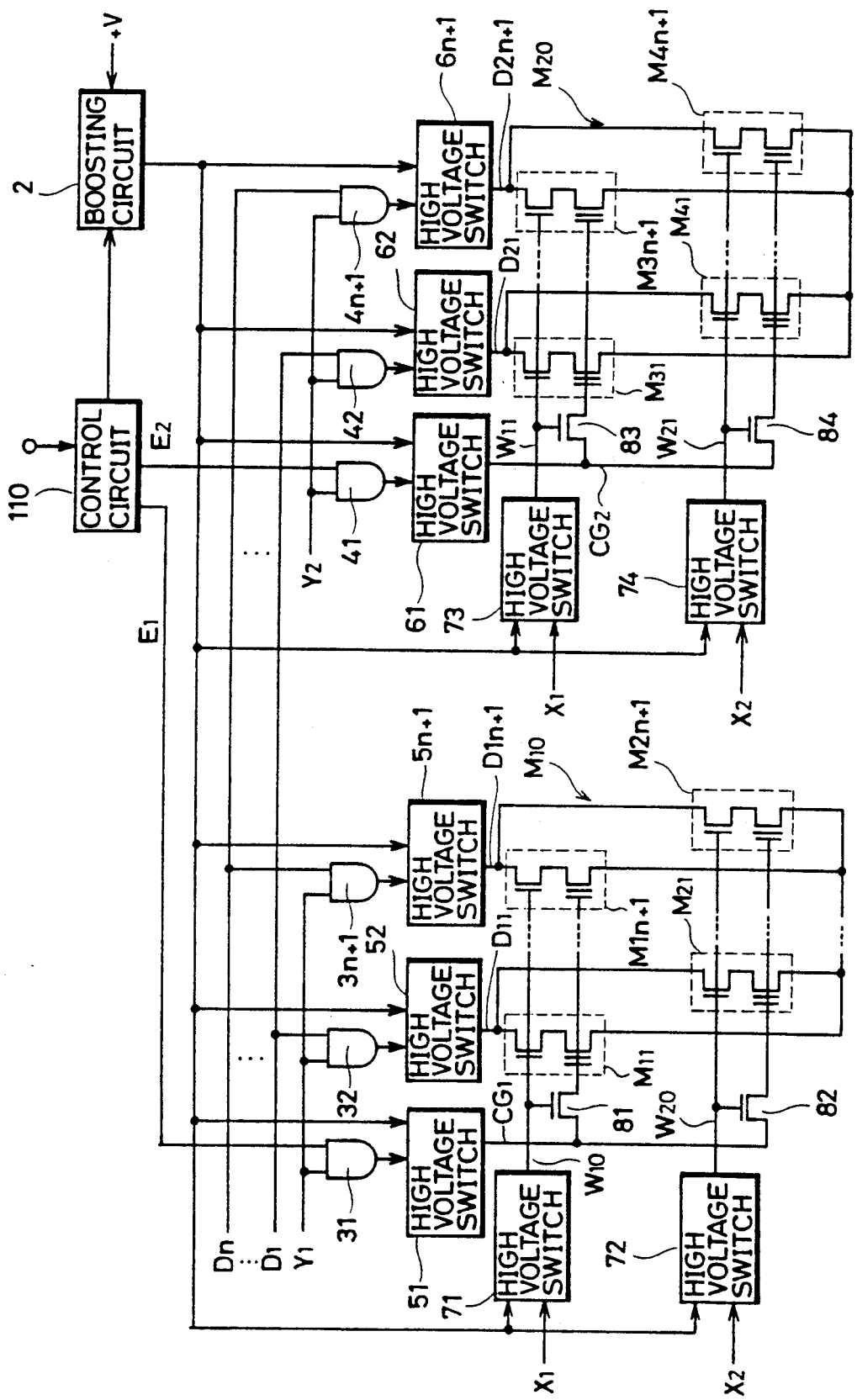
FIG. 2 is a schematic block diagram of memory cell and the peripheral portions shown in FIG. 1.
Figure 6:
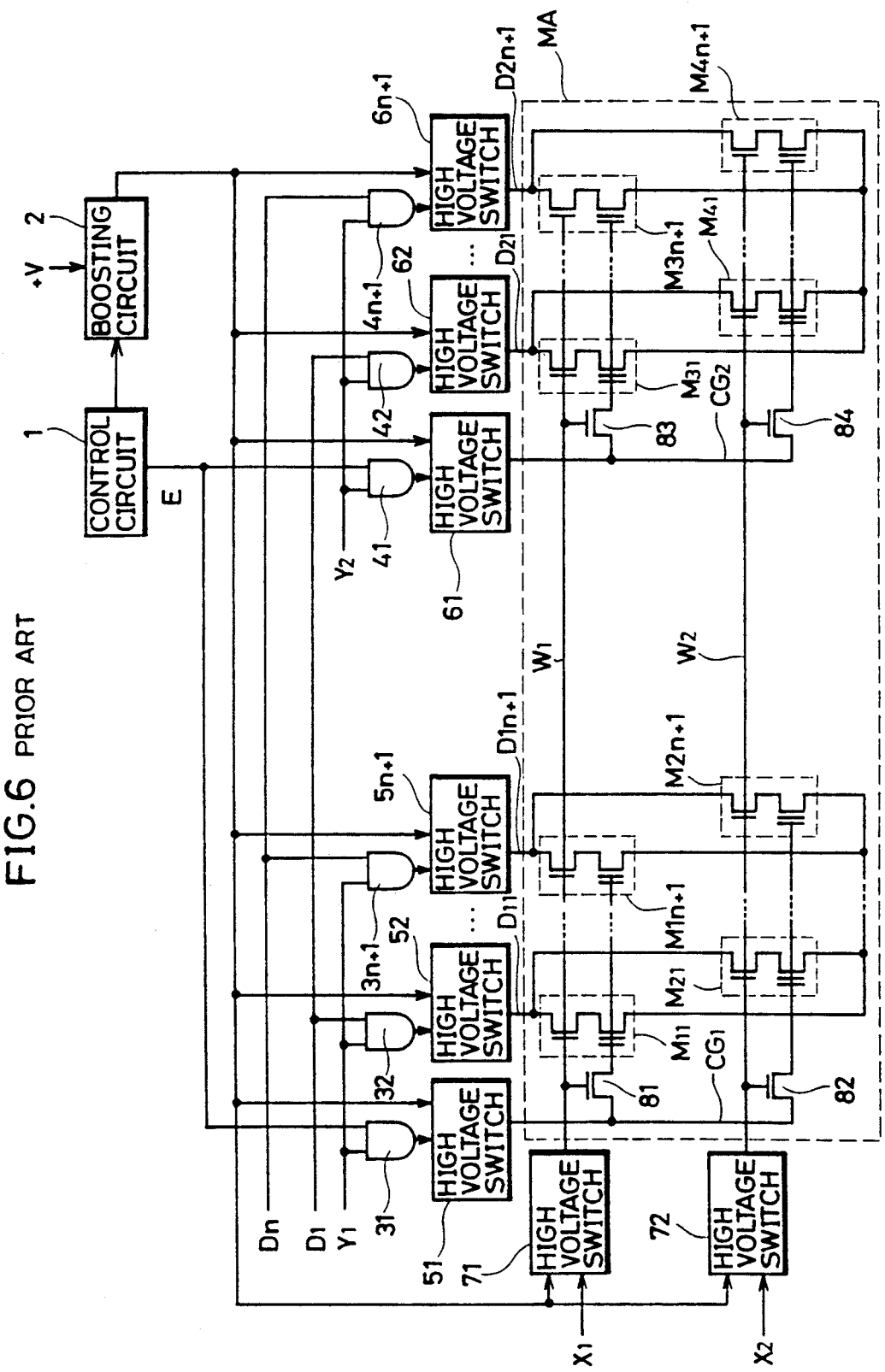
FIG. 6 is a specific prior art block diagram of the memory cell and the peripheral portions shown in FIG. 5.
Figure 7:
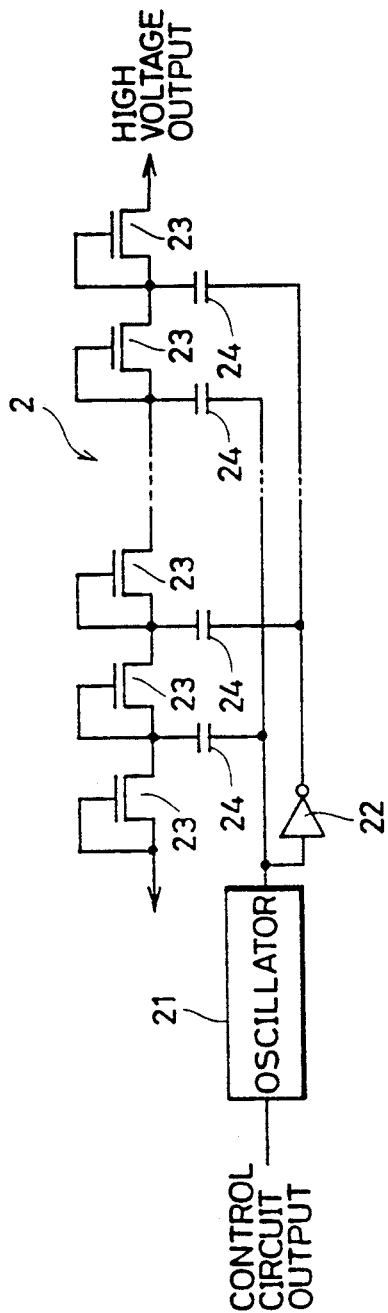
FIG. 7 is a specific prior art electric circuit diagram of the boosting circuit shown in FIG. 6.
Figure 8:
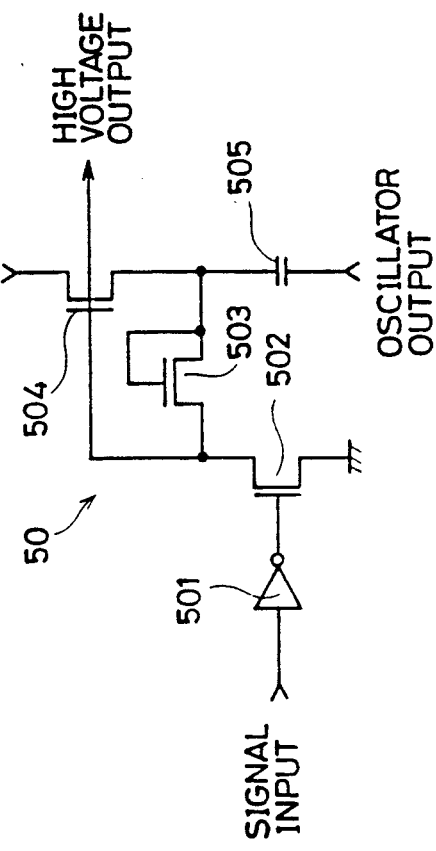
FIG. 8 is a specific prior art electric circuit diagram of a high voltage switch.

FIG. 2 is a specific block diagram showing the memory cell and the peripheral portions shown in FIG. 1. The structure of FIG. 2 is the same as that of FIG. 6 described above except the following points. Namely, the area M10 in which only one rewriting is allowed comprises memory cells M11 ... M1n+1 and M21 ... M2n+1. The rewritable area M20 comprises memory cells M31 ... M3n+1 and M41 ... M4n+1. A word signal line W10 of the area M10 is connected to a high voltage switch 71 while a word signal line W20 is connected to a high voltage switch 72. A word signal line W11 of the area M20 is connected to a high voltage switch 73 while a word signal line W21 is connected to a high voltage switch 74. A high voltage is applied from the boosting circuit 2 to the high voltage switches 73 and 74, and address signals X1 and X2 are also applied to the boosting circuit 2 from the address register/decoder 104 shown in FIG. 1.

A control signal E1 is applied from the control circuit 110 to one input end of the AND gate 31. A control signal E2 is applied from the control circuit 110 to one input end of the AND gate 41. The control circuit 110 sets the control signal E1 at the "L" level when only one rewriting of data is to be allowed in the area M10 and otherwise set the signal at the "H" level, in response to a "H" level signal, for example, applied from the external terminal 107 shown in FIG. 1. The control circuit 110 sets the control signal E2 at the "H" level in the writing mode and in the erasing mode.

In response to the control signal E1 set at the "L" level, the high voltage switch 51 sets the control gate signal CG1 to the "L" level. Address signals X1 and Y1 are set to the "H" level and the data D1 to D8 are set at respective values. For example, when the data D1 is set at the "H" level, the high voltage switch 52 applies a high voltage to the digit line D11. On this occasion, since the high voltage switch 71 is also applying a high voltage to the control gate of the memory cell M11, a high voltage is applied to the drain of the memory transistor in the memory cell M11, realizing writing. By forcing the external terminal 107 to the "L" level after the end of writing, possibility of rewriting of the data in the area M10 can be prevented.

Writing of data in the area M20 is carried out by the control circuit 110 setting the control signal E2 at the "L" level. On this occasion, the control signal E1 is set to the "H" level. Namely, the control circuit 110 sets the control signal E1 at the "L" level in order to realize only one rewriting of the area M10, and the control signal E1 is forced to the "H" level when the data are to be rewritten for a number of times in the area M20, whereby a possible rewriting of data in the area M10 can be prevented. The erasing operation of the areas M10 and M20 is the same as that described with reference to FIG. 6.

Figure 3:
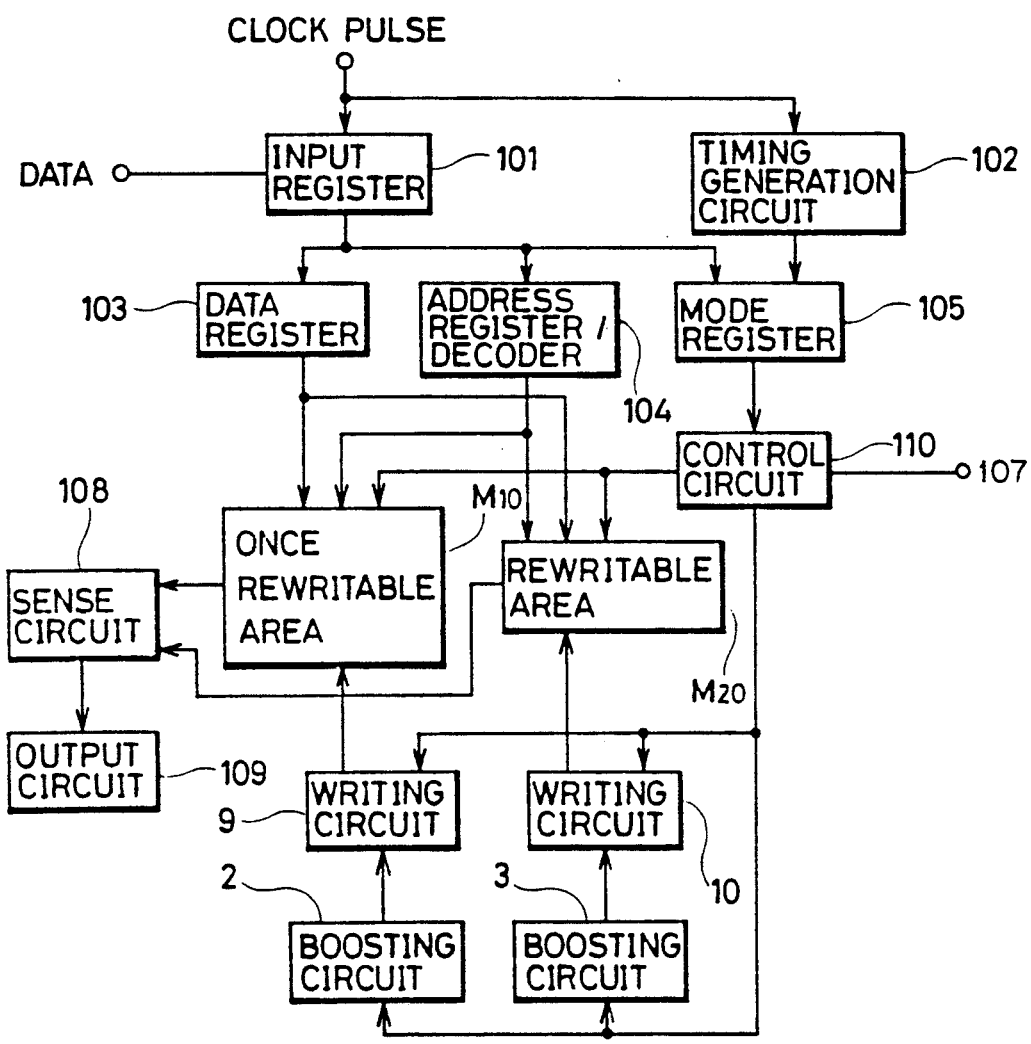
FIG. 3 is a schematic block diagram showing a whole structure of another embodiment of the present invention.

FIG. 3 is a block diagram showing a whole structure of another embodiment of the present invention. The embodiment shown in FIG. 3 comprises a boosting circuit 2 and a writing circuit 9 corresponding to the area M10 and a boosting circuit 3 and a writing circuit 10 corresponding to the area M20 in which the boosting circuit 2 and the writing circuit 9 are operated when only one rewriting of the area M10 is to be carried out.

Figure 4:
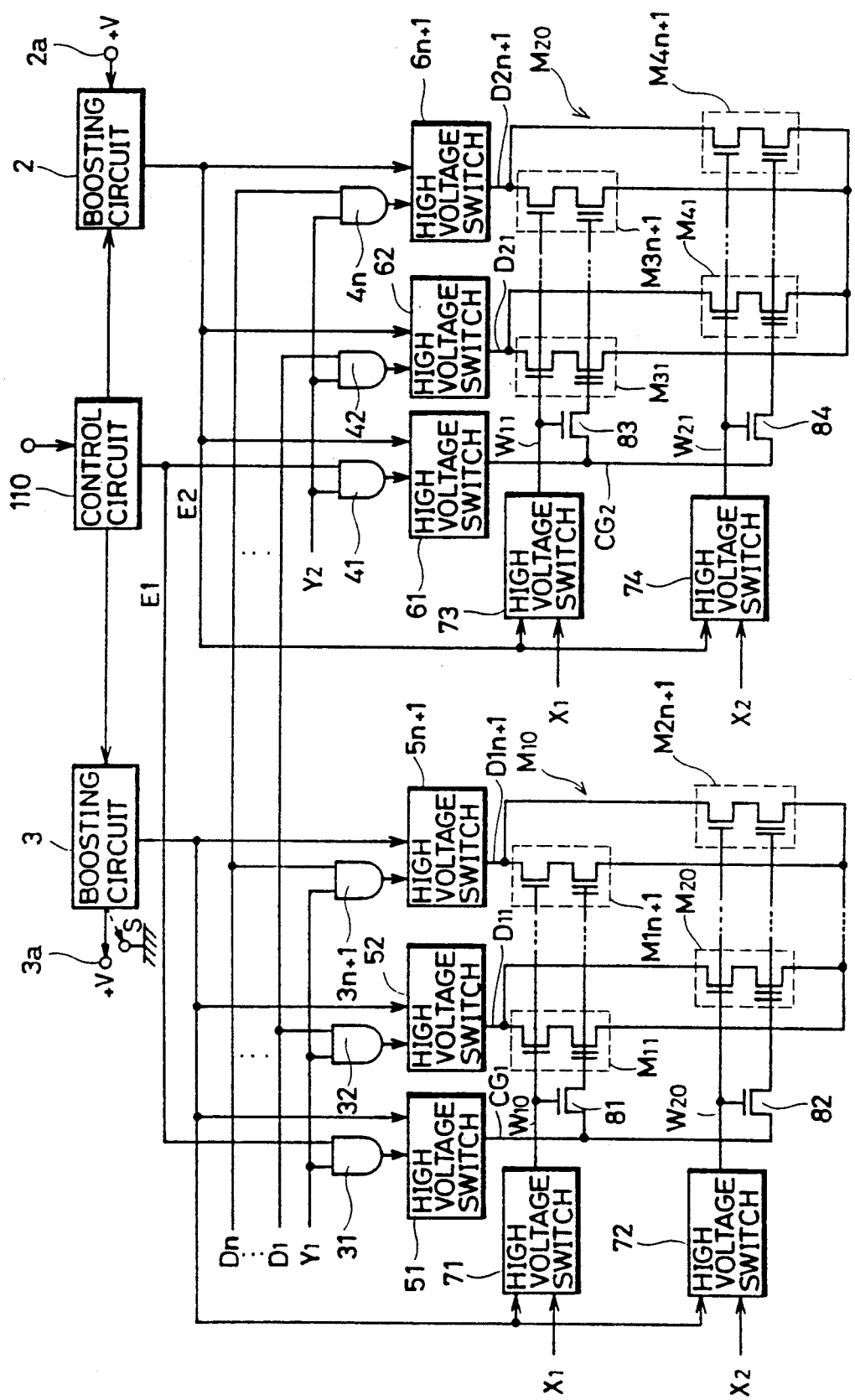
FIG. 4 is a specific block diagram of the memory cell and the peripheral portions shown in FIG. 3.
Figure 5:
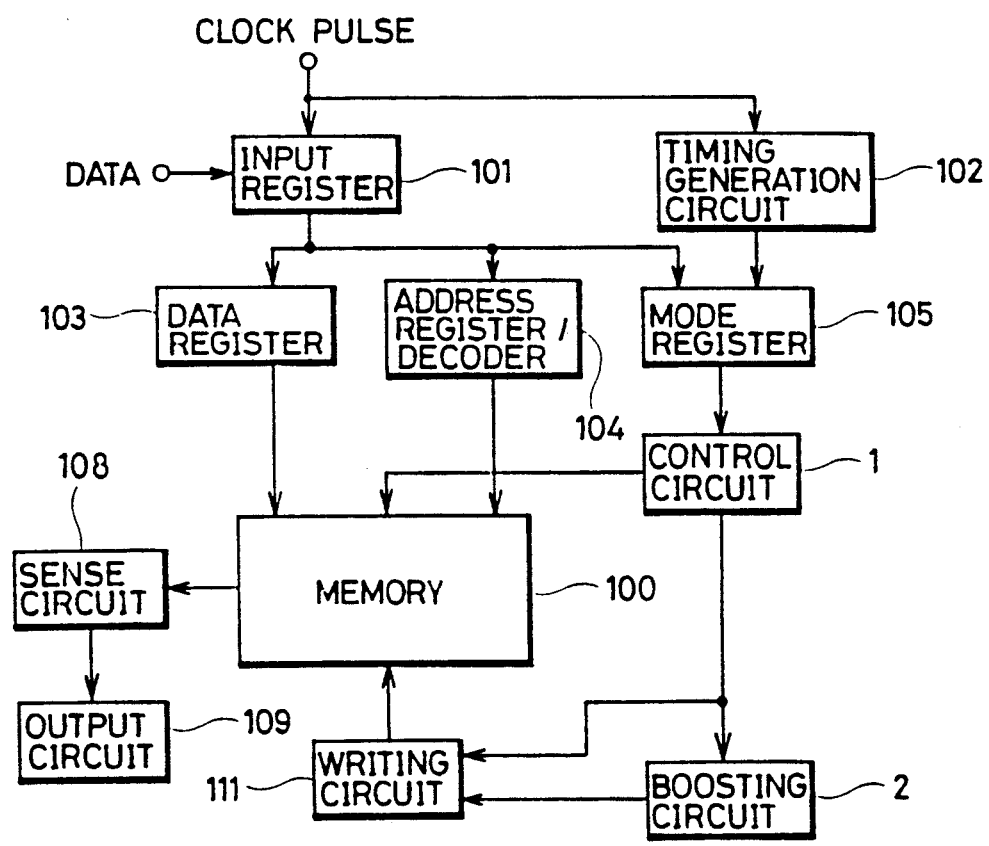
FIG. 5 is a schematic block diagram of a conventional EEPROM.

FIG. 4 is a specific block diagram of the memory cell and peripheral portion shown in FIG. 3. The embodiment of FIG. 4 is the same as that of FIG. 2 except the following points. Namely, a boosting circuit 3 is provided corresponding to the area M10 and a boosting circuit 2 is provided corresponding to the area M20. When only one rewriting of data is to be carried out in the area M10, a control signal is applied from the control circuit 110 to the boosting circuit 3. The boosting circuit 3 generates a high voltage by boosting a supply voltage +V applied to the terminal 3a in response to the control signal, and applies the high voltage to the high voltage switches 51, 52 ... 5n and 71 and 72. On this occasion, the control circuit 110 set the control signal E at the "L" level. Consequently, the control gate signal CG1 attains the "L" level. When the address signals X1 and Y1 are set to the "H" level and the data D1 is set to the "H" level, the high voltage switch 52 applies a high voltage to the drain of the control gate transistor in the memory cell M11 and the high voltage switch 71 applies a high voltage to the gate of the control gate transistor.

Consequently, high voltage is applied to the drain of the memory transistor, realizing data rewriting. By connecting the terminal 3a to the ground instead of the supply voltage +V applied to the boosting circuit 3 after the end of data rewriting in the area M10, writing to the area M10 can be prevented even when the output signal from a controller, not shown, becomes unstable influenced by the turning on/off or an instant stoppage of the power supply and the writing mode is erroneously set. Therefore, possibility of destruction of the data stored in the area M10 can be prevented.

Writing and erasing of data in the area M20 are the same as those in the embodiment shown in FIG. 2.

Although EEPROM is used as a memory cell array in the foregoing, the same effect can be attained by using a mask ROM in the region of the ROM in which data once written are maintained as they are. In that case, data are written in the mask ROM before mounting.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device in which electrical rewriting of data is possible, comprising:
    non-volatile semiconductor memory means including first and second memory areas in which electrical rewriting of data is possible; and
    writing control means for writing in the first memory area of said semiconductor memory means and for allowing writing of data to the second area of said semiconductor memory means when an external writing allowance signal is applied to said writing control means, wherein said writing control means comprises first writing means provided corresponding to the first memory area of said semiconductor memory means for writing data in said first memory area;
    second writing means provided corresponding to the second memory area of said semiconductor memory means for writing data in said second memory area;
    control means responsive to said externally applied signal for applying a write allowing signal to said second writing means so as to carry out writing of data in said second memory area of said semiconductor memory means by said second writing means, and
    address designating means for designating addresses of the first and second memory areas in said semiconductor memory means, wherein
    said control means comprises boosting means for boosting a supply voltage to generate a high voltage;
    said first writing means comprises first switching means responsive to an address signal applied from said address designating means for applying a high voltage from said boosting means to the first memory area of said semiconductor memory means for writing data;
    said second writing means comprises second switching means responsive to the address signal applied from said address designating means and the writing allowing signal applied from said controlling means for applying the high voltage from said boosting means to the second memory area of said semiconductor memory means for writing data, wherein said boosting means comprises
    first high voltage generating means for generating a high voltage for writing data in the first memory area of said semiconductor memory means, and
    second high voltage generating means for generating a high voltage for writing data in the second memory area of said semiconductor memory means.

2. A non-volatile semiconductor memory device in which electrical rewriting of data is possible, comprising:
    non-volatile semiconductor memory means including first and second memory areas in which electrical rewriting of data is possible;
    writing control means for controlling writing in said first and second memory areas;
    said writing control means comprising
    first high voltage generating means for generating a high voltage for writing data in the first memory area of said semiconductor memory means, and
    second high voltage generating means for generating a high voltage for writing data in the second memory area of said semiconductor memory means and
    means for disabling said second high voltage generating means in response to a command signal.

3. A non-volatile semiconductor memory device in which electrical rewriting of data is possible, comprising:
    non-volatile semiconductor memory means including a first memory area for electrical writing of data any number of times and a second memory area for only one-time electrical writing of data;
    first high voltage generating means having a first operating potential input node connected to a source of operating potential for generating a high voltage for writing data in the first memory area of said semiconductor memory means;
    second high voltage generating means having a second operating potential input node connectable to the source of operating potential for generating a high voltage for writing data in the second memory area of said semiconductor memory means; and
    memory overwrite protection means, selectively connecting said second operating potential node to the source of operating potential and a source of ground potential node for, respectively, enabling and disabling said second high voltage generating means.

4. A method of overwrite protection of a non-volatile semiconductor memory device of a type comprising:
    non-volatile semiconductor memory means including a first memory area for electrical writing of data any number of times and a second memory area for only one-time electrical writing of data;
    a first high voltage generating means having a first operating potential input node connected to a source of operating potential and being responsive to a write control signal for generating a high voltage for writing data in the first memory area of said semiconductor memory means, and a second high voltage generating means having a second operating potential input node connectable to the source of operating potential and being responsive to the write control signal for generating a high voltage for writing data in the second memory area of said semiconductor memory means; the overwrite protection method comprising the steps of:

connecting said second operating potential node to the source of operating potential during a one write cycle; and thereafter disconnecting said second operating potential node from said source of operating potential and connecting said second operating potential node to a source of ground potential.

* * * * *